(12) United States Patent
Brown

(10) Patent No.: US 6,504,767 B1
(45) Date of Patent: Jan. 7, 2003

(54) DOUBLE DATA RATE MEMORY DEVICE HAVING OUTPUT DATA PATH WITH DIFFERENT NUMBER OF LATCHES

(75) Inventor: Jason M. Brown, Coppell, TX (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 09/651,139

(22) Filed: Aug. 30, 2000

(51) Int. Cl.[7] .................................................. G11C 7/10
(52) U.S. Cl. .................. 365/189.05; 365/190; 365/196; 365/195; 365/191; 365/194; 365/233; 365/208
(58) Field of Search ............................ 365/233, 189.05, 365/190, 205, 208, 196, 195, 191, 194

(56) References Cited

U.S. PATENT DOCUMENTS 6,128,233 A * 10/2000 Yu et al. ................. 365/189.02
6,147,913 A * 11/2000 Yu et al. ................. 365/189.02
6,154,393 A * 11/2000 Otsuka et al. ......... 365/189.02
6,201,760 B1 * 3/2001 Yun et al. .................... 365/233
6,222,411 B1 * 4/2001 Chu et al. .................... 327/295
6,278,637 B1 * 8/2001 Kawaguchi ............ 365/189.05
6,337,830 B1 * 1/2002 Faue ..................... 365/230.04

* cited by examiner

Primary Examiner—Andrew Q. Tran
(74) Attorney, Agent, or Firm—Schwegman, Lundberg, Woessner & Kluth, P.A.

(57) ABSTRACT

A memory device having a plurality of data paths connected between a main memory by a plurality of data pads. Each of the data path transfers a first and second data bits from the main memory to a data pad in one clock cycle during a read operation. The first data bit is transferred to the data pad in a shorter path than the path of the second data bit.

36 Claims, 4 Drawing Sheets

DOUBLE DATA RATE MEMORY DEVICE HAVING OUTPUT DATA PATH WITH DIFFERENT NUMBER OF LATCHES

TECHNICAL FIELD OF THE INVENTION

The present invention relates generally to digital memory devices, and in particular to output paths for memory devices.

BACKGROUND OF THE INVENTION

Memory devices such as synchronous dynamic random access memory (SDRAM) devices are widely used to store data in computers and electronic products. An SDRAM device typically has a large number of memory cells. The memory cells are usually arranged in rows and columns.

Data are read from the memory cells by a read operation. In some SDRAM devices, a read operation transfers one bit of data from one memory cell to an output data pad within one clock cycle. In a double data rate (DDR) SDRAM, two bits of data from two memory cells are transferred to an output data pad in one clock cycle during a read operation.

A DDR SDRAM typically accesses two data bits at a time from the memory cells, and transfers them via a data path; so that one bit can be read to the data pad on a rising clock edge, and the other on the next falling clock edge. Previous data paths, however, take longer than necessary to deliver the data bits to the data pad, and queue up the data bits unnecessarily.

There is a need for a DDR SDRAM having improved data paths to transfer a first bit of data to a data pad via shortest path during a read operation.

SUMMARY OF THE INVENTION

The present invention provides a memory device having an improved data path to transfer a first bit of data to data pads via a shortest path.

One aspect provides a memory device including a main memory, a plurality of data pads, and a plurality of data paths connected between the main memory and the data pads. Each of the data path transfers a first and second bits of data from the main memory to a data pad in one clock cycle during a read operation. The first bit of data is transferred to the data pad in a shorter path than the path of the second bit of data.

Another aspect provides a method of transferring data in a memory device. The method includes receiving a first data bit at a first data sense amplifier and receiving a second data bit at a second data sense amplifier. The first data bit is transferred through a first output path to a data pad, and the second data bit is transferred through a second output path to the data pad. The first data bit takes less time than the second data bit, and both the first and second data bits are completed in one clock cycle.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
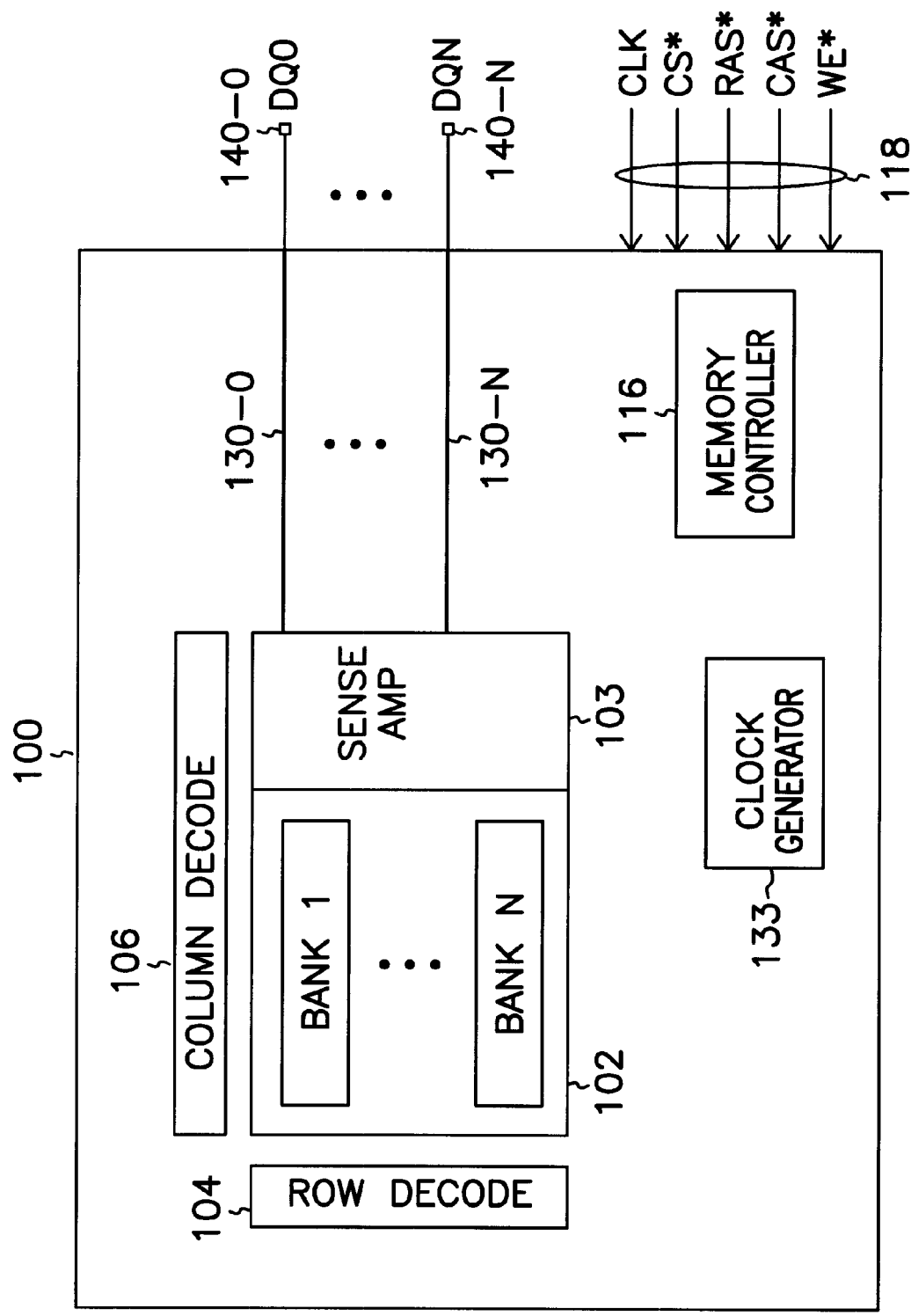
FIG. 1 is a simplified block diagram of a memory device according to one embodiment of the invention.

FIG. 1 is a simplified block diagram of a memory device 100 according to one embodiment of the invention. Memory device 100 includes a main memory 102. Main memory 102 typically includes dynamic random access memory (DRAM) devices having one or more memory banks, indicated by BANK 1–N. Each of the memory banks BANK 1–N includes a plurality of memory cells arranged in rows and columns. Main memory 102 connects to a plurality of sense amplifiers 103. Row decode 104 and column decode 106 access individual memory cells in the rows and columns in response to an address, provided on address bus or address lines 110 (ADDRESS). Data paths 130 0–N connect to a plurality of input/output data (DQ) pads 140 0–N for outputting data from main memory 102 to data pads 140 0–N. A memory controller 116 controls memory 100 responding to control signals provided on control lines 118. The control signals include, but are not limited to, an input clock (CLK), Chip Select (CS*), Row Access Strobe (RAS*), Column Access Strobe (CAS*), and Write Enable (WE*). In addition, a clock generator 133 generates control clock signals for controlling the timing of memory 100. The control clock signals include, but are not limited to, a memory clock signal CLOCK and other conventional control clock signals such as signals CLKDSA, CLKA, CLKB, CLK2, CLKout1st, and CLKout2nd. The timing of these clock signals is described in detail in connection with FIG. 3. It will be appreciated by those skilled in the art that the memory device 100 of FIG. 1 can include additional circuitry and control signals, and that the memory device of FIG. 1 has been simplified to help focus on the invention.

The above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Alternative types of devices include SRAM (Static Random Access Memory) and Flash memories. Additionally, the DRAM could be a synchronous DRAM commonly referred to as SGRAM (Synchronous Graphics Random Access Memory), SDRAM (Synchronous Dynamic Random Access Memory), and SDRAM II, as well as Synchlink or Rambus DRAMs. Furthermore, Double Data Rate refers to a rate of data being transferred between main memory 102 and data pad 140 0–N. In Double Data Rate memories, two bits of data are transferred within one cycle of the CLOCK signal. Moreover, terms such as data, data bit and bit of data describe the same subject, which is data written to or read from main memory 102. These terms are used interchangeably throughout the description of the invention.

Figure 2:
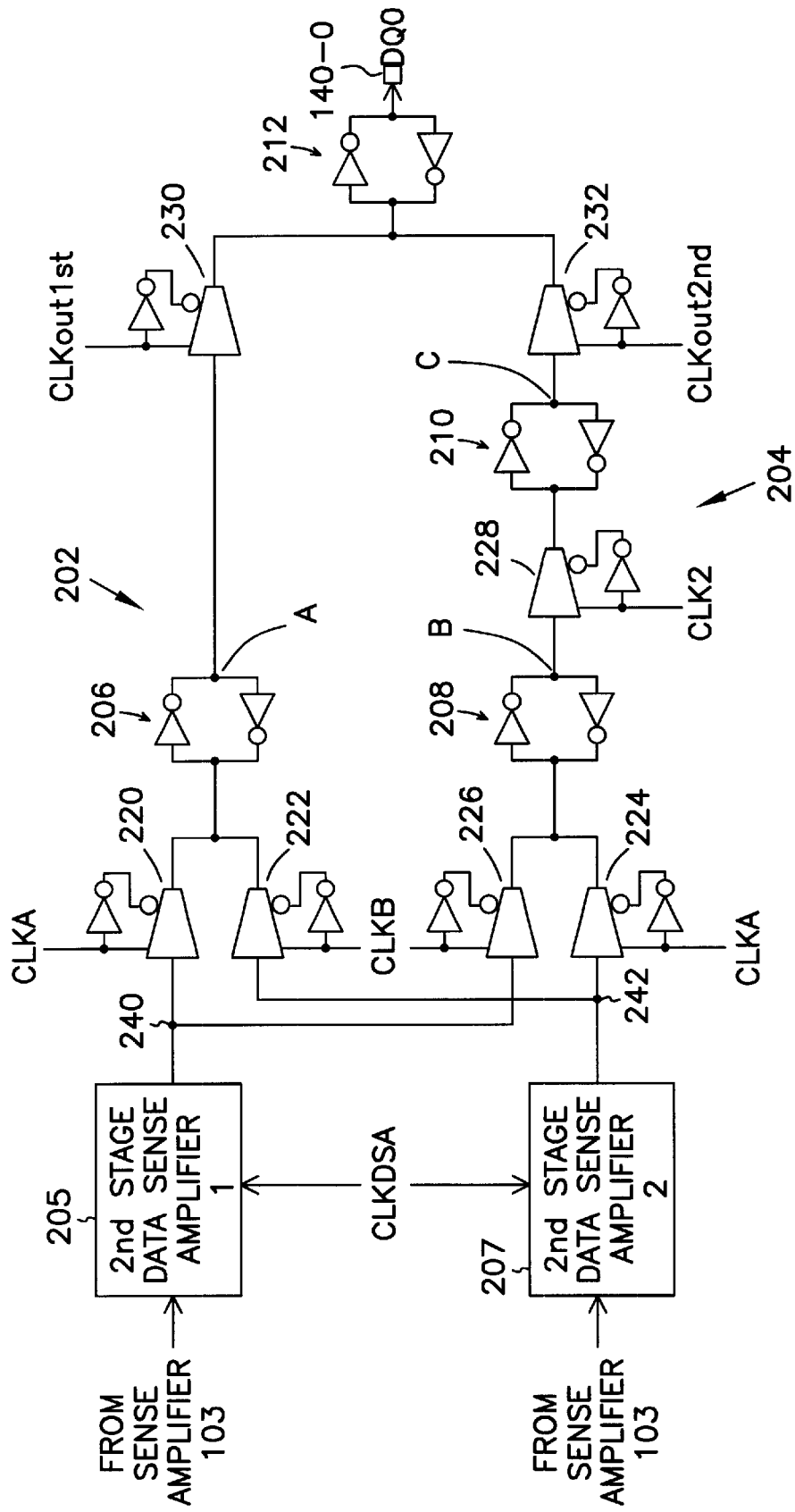
FIG. 2 is a schematic diagram of a data path of the memory device of FIG. 1.

FIG. 2 is a schematic diagram of data path 130-0 of FIG. 1. Data path 130-0 includes a first output path 202 and a second output path 204. First output path 202 transfers the first of two data bits from sense amplifiers 103 to data pad DQ0 at node 140-0 through a second stage data sense amplifier 205 and a series of latches including latches 206, 230 and 212. Second output path 204 transfers the second of two data bits from second stage sense amplifier 207 to data pad DQ0 at node 140-0 through another series of latches including latches 208, 210 and 212. As can be seen from FIG. 2, the number of latches of first output path 202 is smaller than the number of latches of second output path 204. Data transferred to the latches are controlled by a plurality of multiplexors (MUX) and control clock signals.

In first output path 202, data transferred to latch node A is controlled by MUX 220 and 222, which receive clock signals CLKA and CLKB, respectively. In second output path 204, data transferred to latch node B is controlled by MUX 224 and 226, which also receive clock signals CLKA and CLKB, respectively. Data at node C is controlled by MUX 228 which receives control signal CLK2. Data output to node 140-0 is controlled by MUX 230 and 232 which receive clock signals CLKout1st or CLKout2nd, respectively. In addition, data provided on nodes 240 and 242 from data sense amplifiers 205 and 207 are controlled by the same clock signal CLKDSA.

During a memory read operation, data from main memory 102 are accessed and are sent to data sense amplifier 205 and 207 through sense amplifiers 103. Through appropriate timing operation, the data are subsequently transferred to data pad 140-0 at a rate of two data bits for every clock cycle. Detailed operation of data path 130-0 of FIG. 2 is described below in conjunction with a timing diagram of FIG. 3.

Figure 3:
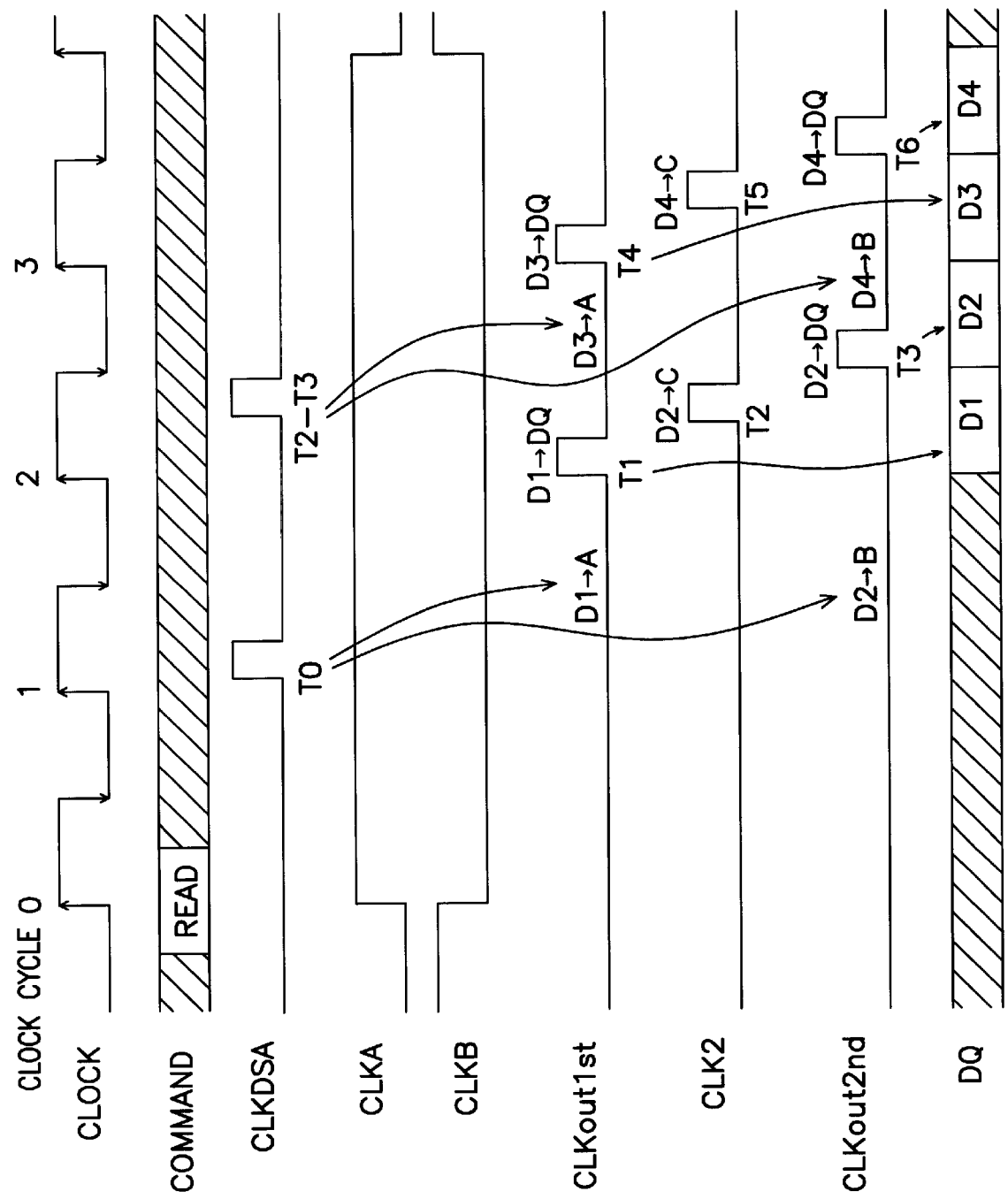
FIG. 3 is a timing diagram showing the operation the data path of FIG. 2.

FIG. 3 is a timing diagram illustrating the operation of data path 130-0 of FIG. 2. In the Figure, CLOCK indicates a timing of the memory clock. DQ indicates bits of data from main memory 102 output at node 140-0. For simplicity, only four bits of data (D1–D4) from main memory 102 are assumed to be output at node 140-0. It is also assumed that the initial address of a column of main memory 102 being accessed is even. In this case, CLKB (FIG. 2) is not activated but remains in a low signal level (LOW). When CLKB is LOW, MUX 222 and 226 are not operative. However, if the initial address of a column being accessed is odd, then CLKB is activated, causing MUX 222 and 226 to operate. In this case, CLKA is not activated; consequently, MUX 220 and 224 are not operative. It is also assumed that memory device 100 is programmed to have a latency of two. Thus, when a READ command is received, a first data bit from main memory 102 will be output at node 140-0 after two clock cycles of the CLOCK signal. Since the number of latches of the first output path 202 is less than the number of latches of second output path 204; a first data bit transferred to the data pad from the first sense amplifier takes less time than the second data bit transferred to the data pad from the second data sense amplifier. In other words, first output path 202 has a smaller propagation delay than second path 204, this is key because path 202 will always output its data one-half clock period before a data is output from path 204.

When a certain combination of the control signals (RAS*, CAS*, WE*, shown in FIG. 1) is valid for a read operation, memory device 100 initiates a READ command. In FIG. 3, the READ command is initiated at the beginning of cycle 0 of the CLOCK signal. After data bits are read from main memory 102, sense amplifiers 103 transfer the data bits, D1 and D2, to data sense amplifiers 205 and 207, respectively. At time T0, CLKDSA signal transitions to a high signal level (HIGH) enabling data sense amplifiers 205 and 207 to transfer D1 and D2 to nodes 240 and 242, respectively. At time T1, CLKout1st signal transitions HIGH to activate MUX 230, which allow D1 to be output at node 140-0. At time T2, CLK2 signal transitions HIGH, allowing D2 to pass through MUX 228 to node C. At time T3, CLKout2nd transitions HIGH to let D2 pass through MUX 232 to data pad 140-0. In the meantime, the next two data bits D3 and D4 are transferred to data sense amplifiers 205 and 207. These two data bits D3 and D4 are output to node 140-0 in the same manner as D1 and D2. When CLKDSA signal transitions HIGH between time T2 and T3, D3 and D4 are transferred to nodes A and B, respectively. At time T4, CLKout1st signal transitions HIGH, allowing D3 to pass through MUX 230 to node 140-0. At time T5, CLK2 signal transitions HIGH, allowing D4 to pass through MUX 228 to node C. At time T6, CLKout2nd transitions HIGH allowing D4 to pass through MUX 232 to data pad 140-0.

Thus, within two clock cycles, four data bits (D1–D4) are output to node 140-0, with two bits for each cycle. Since output path 202 has fewer latches than output path 204, the number of control signals needed to control the timing of output path 202 is less than that of output path 204; therefore, the first output path transfers the first data bit (D1) to the data pad in less time than the second output path transfers the second data bit (D2) to the data pad. In other words, since output path 202 and output path 204 are not symmetrical (are asymmetrical), and output path 202 has fewer latches than the number of latches of the second output path 204. The first data bit is transferred to data pad 140-0 in a shorter time; thus memory device 100 can operate at a faster operating frequency. In addition, in the description of FIG. 3, memory device 100 is assumed to be programmed with latency setting of two, in other embodiments, however, memory device 100 can be programmed to have other latency settings, e.g. latency of three or four. Regardless of latency setting, the timing of clock signal CLKDSA is always the same.

Figure 4:
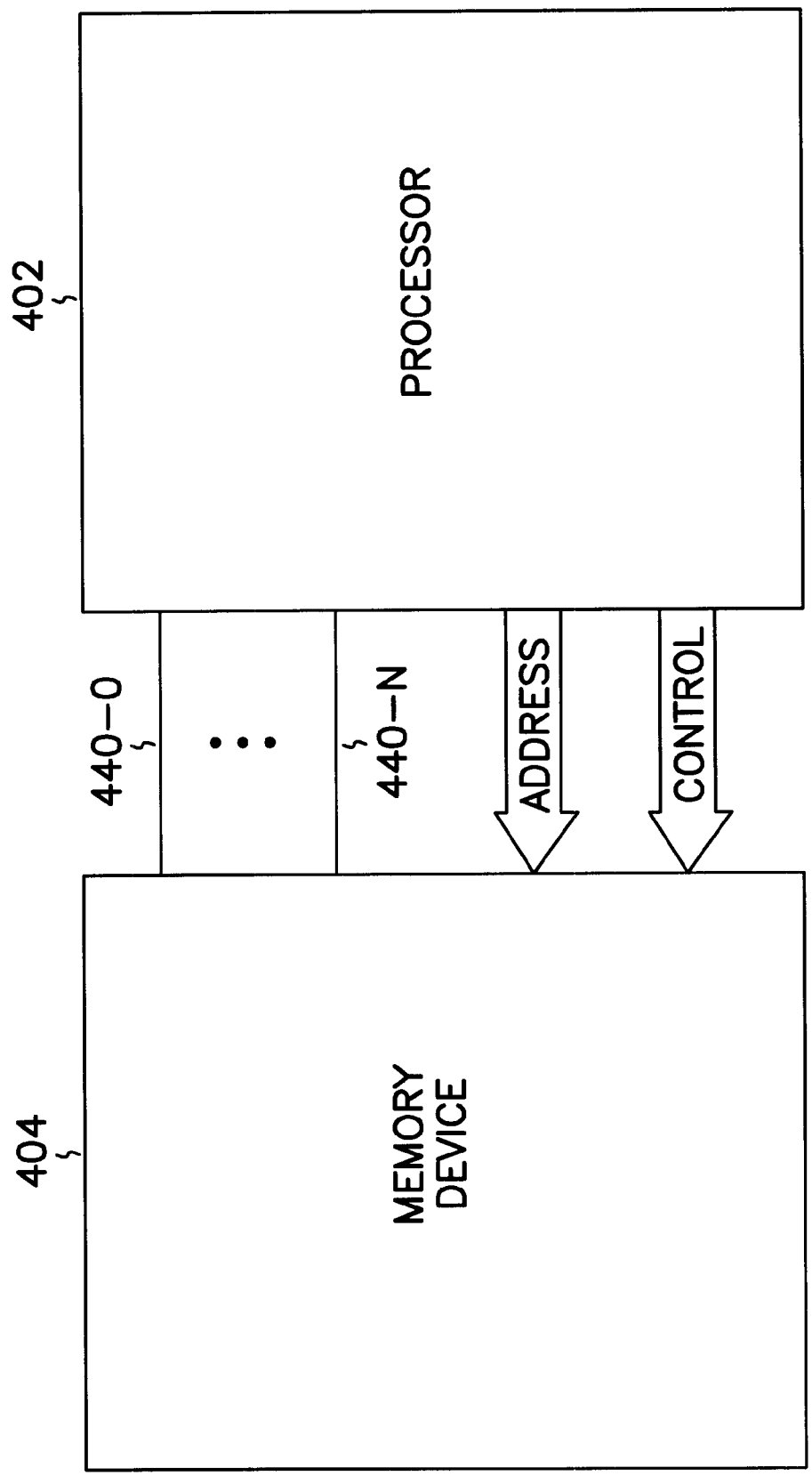
FIG. 4 illustrates a system according to one embodiment of the invention.

FIG. 4 illustrates a system according to the invention. In the Figure, system 400 includes a processor 402 connected to a memory device 404. Memory device 404 includes the embodiments of data paths 140 0–N described in FIG. 2. According to the invention, processor 402 provides control signals to memory device 404 via control lines (CONTROL). Data communication between the processor and the memory is transmitted via data pads 440 0–N, and addresses are provided to the memory via address lines (ADDRESS).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A memory device for transferring two data bits to a data pad for every cycle of a clock, the memory device comprising:
   a first data sense amplifier for receiving a first data bit;
   a second data sense amplifier for receiving a second data bit;
   a first number of latches connected between the first data sense amplifier and, the data pad for receiving the first data bit from the first data sense amplifier based on an enable clock signal having the same timing with different latency settings of the memory device; and a second number of latches connected between the second data sense amplifier and the data pad for receiving the second data bit from the second sense amplifier based on the enable clock signal, wherein the first data bit transferred to the data pad from the first data sense amplifier takes less time than the second data bit transferred to the data pad from the second data sense amplifier.

2. The memory device of claim 1, wherein the first number of latches and the second number of latches are not equal.

3. The memory device of claim 1, wherein the first number of latches is an even number and the second number of latches is an odd number.

4. The memory device of claim 1, wherein the first number of latches is two and the second number of latches is three.

5. The memory device of claim 1, wherein the first and second bits of data are serially transferred to the data pad.

6. A memory device for transferring two data bits to a data pad for every cycle of a clock, the memory device comprising:
   a first data sense amplifier for receiving a first data bit;
   a second data sense amplifier for receiving a second data bit;
   a first number of latches connected between the first data sense amplifier and the data pad; and
   a second number of latches connected between the second data sense amplifier and the data pad, wherein the first data bit transferred to the data pad from the first data sense amplifier takes less time than the second data bit transferred to the data pad from the second data sense amplifier, wherein the first and second data sense amplifiers are enabled by a clock signal, wherein the timing of the clock signal is always the same with different latency settings of the memory device.

7. A double data rate memory device comprising:
   a data pad; and
   a data path connected to the dada pad, the data path including:
      a first output path having a first number of latches, and a first data sense amplifier for transferring a first data bit to the first number of latches based on an enable clock signal having the same timing with different latency settings of the memory device; and
      a second output path having a second number of latches, and a second data sense amplifier for transferring a second data bit to the second number of latches based on the enable clock signal, wherein the first number of latches is different from the second number of latches.

8. The memory device of claim 7, wherein the first output path transfers the first data bit to the data pad in less time than the second output path transfers the second data bit to the data pad.

9. The memory device of claim 7, wherein the first number of latches is two and the second number of latches is three.

10. The memory device of claim 7, wherein the first and second data bits are serially transferred to the data pad.

11. The memory device of claim 7, wherein the first output path has a smaller propagation delay than a propagation delay of the second output path.

12. A double data rate memory device comprising:
   a data pad; and
   a data path connected to the dada pad, the data path including:
      a first output path having a first data sense amplifier connected to a first number of latches, the first data sense amplifier receiving a first data bit; and
      a second output path having a second data sense amplifier connected to a second number of latches, the second data sense amplifier receiving a second data bit, wherein the first number of latches is different from the second number of latches, wherein the first and second data sense amplifiers are enabled by a clock signal, wherein the timing of the clock signal is always the same with different latency settings of the memory device.

13. A memory device comprising:
   a main memory;
   a plurality of data pads; and
   a plurality of data paths connected between the main memory and the data pads, wherein one data path connects to one data pad, wherein each of the data paths includes a first and second output paths, wherein the first and second output paths have different numbers of latches, wherein each of the data paths includes a clock node to receive an enable clock signal having the same timing in different latency settings of the memory device for transferring a data bit on the first and second output paths.

14. The memory device of claim 13, wherein the first output path includes two latches and the second output path includes three latches.

15. The memory device of claim 13, wherein the first output path transfers a first data bit from the main memory to the data pad, and wherein the second output path transfers a second data bit from the main memory to the data pad in the same clock cycle as the first data bit.

16. The memory device of claim 15, wherein the first output path transfers the first data bit in less time than the second output path transfers the second data bit.

17. The memory device of claim 16, wherein the first and second data bits are serially transferred to the data pad.

18. A memory device for outputting more than one bits of data for every cycle of a clock, the memory device comprising:
   a main memory for holding data;
   a plurality of data pads for outputting data from the main memory; and
   a plurality of data paths for transferring data from the main memory to the data pads, wherein one data path connects to one data pad, wherein each of the data paths includes:
      a first output path connected to the data pad, the first output path including N number of latches; and
      a second output path connected to the data pad, the second output path including M number of latches, wherein N is not equal to M, wherein each of the data paths includes a clock node to receive an enable clock signal having the same timing in different latency settings of the memory device for transferring a data bit on the first and second output paths.

19. The memory device of claim 18, wherein N is an even number and M is an odd number.

20. The memory device of claim 18, wherein N is two and M is three.

21. The memory device of claim 18, wherein the first output path transfers a first data bit from the main memory to the data pad, wherein the second output path transfers a second data bit from the main memory to the data pad, wherein the first and second data bits are transferred in one clock cycle.

22. The memory device of claim 21, wherein the first output path transfers the first data bit in less time than the second output path transfers the second data bit.

23. The memory device of claim 22, wherein the first and second data bits are serially transferred to the data pad.

24. A memory device comprising:

a main memory;

a plurality of data pads; and a plurality of data paths connected between the main memory and the data pads, each of the data path transfers a first and second bits of data from the main memory to a data pad in one clock cycle during a read operation, wherein the first bit of data is transferred to the data pad in a shorter path than the path of the second bit of data, wherein each of the data paths includes a clock node to receive an enable clock signal having the same timing in different latency settings of the memory device for transferring the first bit of data and the second bit of data on each of the data paths.

25. The memory device of claim 24, wherein each of the data paths connects to one data pad, and wherein each of the data paths includes a first and a second output path.

26. The memory device of claim 25, wherein the first output path includes a number of latches and the second output path includes a different number of latches.

27. The memory device of claim 25, wherein the first output path includes two latches and the second output path includes three latches.

28. A system comprising:

a processor; and a memory device connected to the processor, the memory device comprising:

a main memory;

a plurality of data pads; and a plurality of data paths connected between the main memory and the data pads, each of the data path transfers a first and second bits of data from the main memory to a data pad in one clock cycle during a read operation, wherein the first bit of data is transferred to the data pad in a shorter path than the path of the second bit of data, wherein each of the data paths includes a clock node to receive an enable clock signal having the same timing in different latency settings of the memory device for transferring the first and second bits of data on each of the data paths.

29. The system of claim 28, wherein each of the data paths connects to one data pad, and wherein each of the data paths includes a first and a second output path, wherein the first and second output path have different number of latches.

30. The system of claim 28, wherein each of the data paths connects to one data pad, and wherein each of the data paths includes a first and a second output path, wherein the first output path has a smaller propagation delay than a propagation delay of the second output path.

31. A method of transferring data in a memory device, the method comprising:

receiving a first data bit at a first data sense amplifier;

receiving a second data bit at a second data sense amplifier;

transferring the first data bit through a first output path to a data pad based on an enable clock signal having the same timing in different latency settings of the memory device; and transferring the second data bit through a second output path to the data pad based on the enable clock signal, wherein transferring the first data bit takes less time than transferring the second data bit, wherein transferring the first and second data bits is completed in one clock cycle.

32. The method of claim 31, wherein transferring the first data bit includes transferring the first data bit through N number of latches, wherein transferring the second data bit includes transferring the second data bit through M number of latches, wherein N is not equal to M.

33. A method of reading data in a memory device, the method comprising:

initiating a read command;

transferring a first data bit and second data bit to a data path connected to a data pad based on an enable signal having the same timing in different latency settings of the memory device;

transferring the first data bit to the data pad via one output path of the data path based on the enable signal; and transferring the second data bit to the data pad via another output path of the data path, wherein transferring the first data bit takes less time than transferring the second data bit, wherein transferring the first and second data bits is completed in one clock cycle.

34. The method of claim 33, wherein transferring the first data bit includes transferring the first data bit through N number of latches, wherein transferring the second data bit includes transferring the second data bit through M number of latches, wherein N is not equal to M.

35. A memory device comprising:

a first data sense amplifier;

a second data sense amplifier;

a first number of latches connected between the first data sense amplifier and a data pad for receiving a first data bit from the first data sense amplifier based on an enable clock signal having the same timing for different latency settings of the memory device; and a second number of latches connected between the second data sense amplifier and the data pad for receiving a second data bit from the second data sense amplifier based on the enable clock signal.

36. The memory device of claim 35, wherein the first number of latches and the second number of latches have unequal number of latches.

* * * * *